(12) United States Patent
Bryant et al.

(10) Patent No.: US 9,805,990 B2
(45) Date of Patent: Oct. 31, 2017

(54) FDSOI VOLTAGE REFERENCE

(71) Applicant: GLOBALFOUNDRIES INC., Grand Cayman (KY)

(72) Inventors: Andres Bryant, Burlington, VT (US); Edward J. Nowak, Shelburne, VT (US); Robert R. Robison, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/751,557

(22) Filed: Jun. 26, 2015

(65) Prior Publication Data

US 2016/0380100 A1 Dec. 29, 2016

(51) Int. Cl.
| | | |
|---|---|---|
| *H01L 21/84* | (2006.01) | |
| *G05F 3/16* | (2006.01) | |
| *H01L 29/786* | (2006.01) | |
| *H01L 27/12* | (2006.01) | |

(52) U.S. Cl.
CPC .............. *H01L 21/845* (2013.01); *G05F 3/16* (2013.01); *H01L 21/84* (2013.01); *H01L 27/1203* (2013.01); *H01L 29/78696* (2013.01); *H01L 27/1211* (2013.01)

(58) Field of Classification Search
CPC ......... H01L 29/7838; H01L 21/823807; H01L 21/845; H01L 27/1211
See application file for complete search history.

(56) References Cited

U.S. PATENT DOCUMENTS

| | | | |
|---|---|---|---|
| 6,023,189 A | 2/2000 | Seelbach | |
| 6,196,203 B1 | 3/2001 | Grieve et al. | |
| 6,441,680 B1 | 8/2002 | Leung et al. | |
| 6,989,659 B2 | 1/2006 | Menegoli et al. | |
| 8,513,739 B2 | 8/2013 | Anderson et al. | |
| 2006/0022274 A1 | 2/2006 | Hasegawa et al. | |
| 2011/0210402 A1* | 9/2011 | Anderson | H01L 21/82345 257/392 |
| 2013/0193525 A1* | 8/2013 | Weis | H03K 17/063 257/379 |

(Continued)

OTHER PUBLICATIONS

Oguey et al., "MOS Voltage Reference Based on Polysilicon Gate Work Function Difference," Jun. 1980, pp. 264-269, IEEE Journal of Solid-State Circuits, vol. SC-15, No. 3.

(Continued)

*Primary Examiner* — Fernando L Toledo
*Assistant Examiner* — Neil Prasad
(74) *Attorney, Agent, or Firm* — Michael Le Strange; Hoffman Warnick LLC

(57) ABSTRACT

An integrated circuit having a reference device and method of forming the same. A reference device is disclosed having: a fully depleted n-type MOSFET implemented as a long channel device having a substantially undoped body; and a fully depleted p-type MOSFET implemented with as a long channel device having a substantially undoped body; wherein the n-type MOSFET and p-type MOSFET are connected in series and employ identical gate stacks, wherein each has a gate electrically coupled to a respective drain to form two diodes, and wherein both diodes are in one of an on state and an off state according to a value of an electrical potential applied across the n-type MOSFET and p-type MOSFET.

20 Claims, 5 Drawing Sheets

(56) References Cited

U.S. PATENT DOCUMENTS

2014/0131813 A1* 5/2014 Liaw .................. H01L 27/1104
257/401

OTHER PUBLICATIONS

Leung et al., "A CMOS Voltage Reference Based on Weighted VGS for CMOS Low-Dropout Linear Regulators," Jan. 2003, pp. 146-150, IEEE Journal of Solid-State Circuits, vol. 38, No. 1.
Zhou et al., "A CMOS Voltage Reference Based on Mutual Compensation of Vtn and Vtp," Jun. 2012, pp. 341-345, IEEE Transactions on Circuits and Systems—II: Express Briefs, vol. 59, No. 6.

* cited by examiner

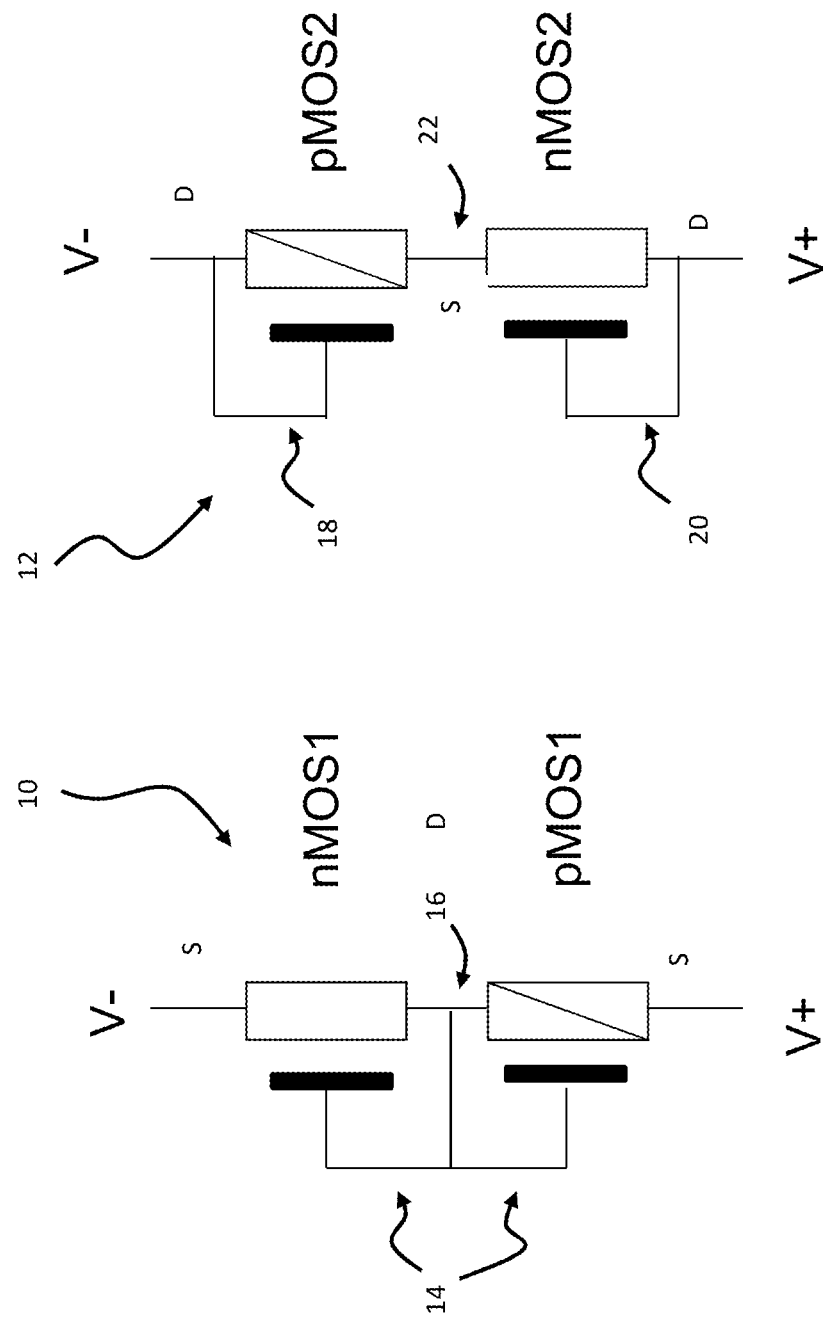

US 9,805,990 B2

FDSOI VOLTAGE REFERENCE

BACKGROUND

The disclosure relates generally to voltage reference structures for field effect transistors (FETs). More specifically, embodiments of the present disclosure include a voltage reference device implemented using fully depleted transistor technology. Fully depleted transistor technology is most commonly fabricated in FinFET CMOS and fully depleted semiconductor on insulator (FDSOI) substrates.

A voltage reference is an electronic device that ideally produces a fixed (i.e., constant) voltage irrespective of the loading on the device, manufacturing process tolerances, power supply variations, temperature changes, and the passage of time. In VLSI technologies, p-n diodes have traditionally been used to provide such a voltage reference due do their ease of manufacturing and predictable behavior.

In more advanced technologies, such as SOI structures and FinFET technologies, it becomes more challenging to make a p-n diode operate in a predictable manner. Instead, additional processing steps are required that add significant cost to the manufacturing process. Accordingly, a need exists for a more cost effective solution for implementing a voltage reference structure in such advanced technologies.

BRIEF SUMMARY

A first aspect of the disclosure provides a reference device, comprising: a fully depleted n-type metal oxide-silicon field effect transistor (MOSFET) implemented as a long channel device having a substantially undoped body; and a fully depleted p-type MOSFET implemented as a long channel device having a substantially undoped body; wherein the n-type MOSFET and p-type MOSFET are connected in series and employ identical gate stacks, wherein each MOSFET has a gate electrically coupled to a respective drain to form two diodes, and wherein both diodes are in one of an on state and an off state according to a value of an electrical potential applied across the n-type MOSFET and p-type MOSFET.

A second aspect of the disclosure provides an integrated circuit (IC) having a reference device, comprising: a fully depleted n-type metal oxide-silicon field effect transistor (MOSFET) implemented as a long channel device having a substantially undoped body; and a fully depleted p-type MOSFET implemented as a long channel device having a substantially undoped body; wherein the n-type MOSFET and p-type MOSFET are connected in series and employ identical gate stacks, wherein each has a gate electrically coupled to a drain, and both are in one of an on state and an off state according to a value of an electrical potential applied across the n-type MOSFET and p-type MOSFET.

A third aspect of the disclosure provides a method of forming a reference circuit, comprising: forming a fully depleted n-type metal oxide-silicon field effect transistor (MOSFET) and a fully depleted p-type MOSFET adjacent each other, wherein both MOSFETs are implemented as long channel devices having substantially undoped bodies, and wherein each has a commonly formed gate stack; and wiring the n-type MOSFET and p-type MOSFET in series in which each has a gate electrically coupled to a drain and both can be placed in one of an on state and an off state according to a value of an electrical potential applied across the n-type MOSFET and p-type MOSFET.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a schematic of a first voltage reference device implemented with FDSOI technology according to embodiments of the present disclosure.

FIG. 2 shows a schematic of a second voltage reference device implemented with FDSOI technology according to embodiments of the present disclosure.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

Figure 3:
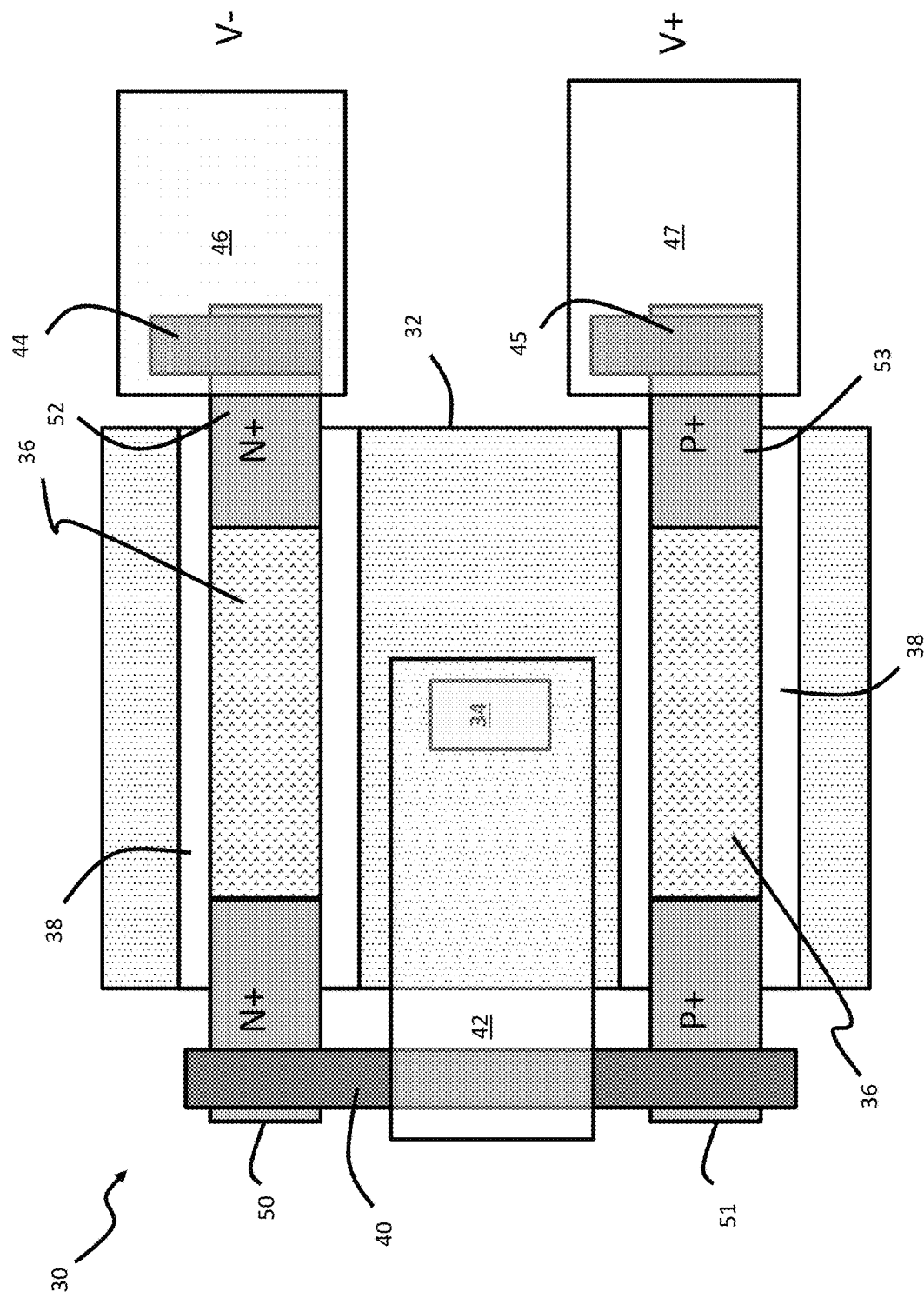
FIG. 3 shows a top view of a first implementation of the device shown in FIG. 1 according to embodiments of the present disclosure.

Embodiments of the present disclosure provide integrated circuit (IC) structures for implementing a reference device (e.g., a voltage reference) using fully depleted semiconductor-on-insulator (FDSOI) technology. FIGS. 1 and 2 depict a pair of illustrative voltage reference circuits 10 and 12, respectively, which include an n-type metal-oxide semiconductor MOSFET (nMOS) and a p-type MOSFET (pMOS). As described herein, both the n-type MOSFET and p-type MOSFET are wired to create a pair of diodes arranged in series and both are fabricated from an identical gate stack to address manufacturing variations. The potential across the two devices provide a reference voltage of, e.g., about 0.7 volts. Two embodiments are described for each circuit 10, 12, including a FinFET implementation and a planar implementation.

In the embodiment of FIG. 1, circuit 10 includes: (1) the source of the nMOS1 coupled to V−; (2) the source of pMOS1 coupled to V+; (3) the drain of nMOS1 and drain of pMOS1 coupled at node 16; and (4) the gates 14 of both devices also coupled to node 16.

Circuit 12 of FIG. 2 alternatively includes: (1) pMOS2 with its drain coupled to V−; (2) nMOS2 with its drain coupled to V+; (3) the sources of both pMOS2 and nMOS2 coupled together at node 22; (4) the gate 18 of the pMOS2 coupled to V−; and (5) the gate 20 of nMOS2 coupled to V+.

The operational concept is described as follows. With reference to circuit 12, assume the circuit consisted of only a single device, e.g., nMOS2, placed in the off state, i.e., with its source 22 tied to ground. A MOSFET is technically in the off state when the applied voltage, Vgs, from the gate to the source is less than a specific value for that MOSFET, called the threshold voltage (Vt). Although technically in the off state, there would still be a leakage current across the device that would operate with a near-ideal behavior, and in particular, is very well controlled and reproducible for a given value of Vgs−Vt. This behavior is found in devices with very thin silicon structures, and is particularly well behaved in structures having undoped channels. An issue that exists however is that the gate 20 is subject to manufacturing variation, so the threshold voltage, Vt, of the device can vary with ordinary manufacturing process variations. This issue is addressed in these embodiments by stacking a pMOS in series with an nMOS, i.e., such that the gates of the pMOS and nMOS are fabricated using the same material stack. Because the manufacturing variation for both gates 18, 20 will presumably be the same, the behavior of gates 18, 20 will be complimentary. Namely, if the threshold voltage of one device is raised, the threshold voltage of the other will be similarly lowered. Accordingly, the manufacturing variation in the gate composition will be canceled out by a circuit having both devices electrically connected in series.

The following FIGS. 3-6 depict various embodiments for implementing the circuits shown in FIGS. 1 and 2. In particular, structures are described in which the nMOS device and pMOS device are manufactured from the same material stack such that the gate composition variations will cancel each other out, thus allowing the circuit to provide an ideal reference device. Both devices are implemented as long channel devices, essentially meaning that they will not exhibit any short channel effects.

FIG. 3 depicts a top, cross-sectional view of an illustrative embodiment of circuit 10 using fully depleted technology implemented as FinFET 30. As shown, a common gate material 32 is used for both an n-type device (N+) and a p-type device (P+). Both devices include a gate insulator (dielectric) 38 with an undoped body thereon between the n-type (N+) source/drain regions and p-type (P+) source/drain regions. A via strap 40 connects the N+ and P+ source regions 50, 51, respectively, which is further coupled to gate via 34 by way of a metal 1 layer 42. N+ and P+ drain regions 52, 53 are coupled to V− and V+ respectively by way of vias 44, 45 and metal 1 regions 46, 47, respectfully.

The fins 36 of the FinFET are surrounded by the gate dielectric 38. The gate length is large such that the subthreshold swing, Ssat=1/[d ln(Ids)/dVg]~kT/Qe, where k is Boltzmann's constant, T is the operating temperature(in K), and Qe is the elementary charge, and the drain-induced barrier lowering (DIBL)=dVt/~0, thus providing a pair of long channel devices having substantially undoped bodies. The source/drain regions may be expanded, e.g., by epi growth. As is the case with each of the described embodiments, the regulator threshold is given according to the equation Vt−Vref=Vtn−Vtp, where Vt is the voltage threshold, Vref is the reference voltage, Vtn is the voltage threshold of the n-type device and Vtp (typically Vtp is negative) is the voltage threshold of the p-type device.

Figure 4:
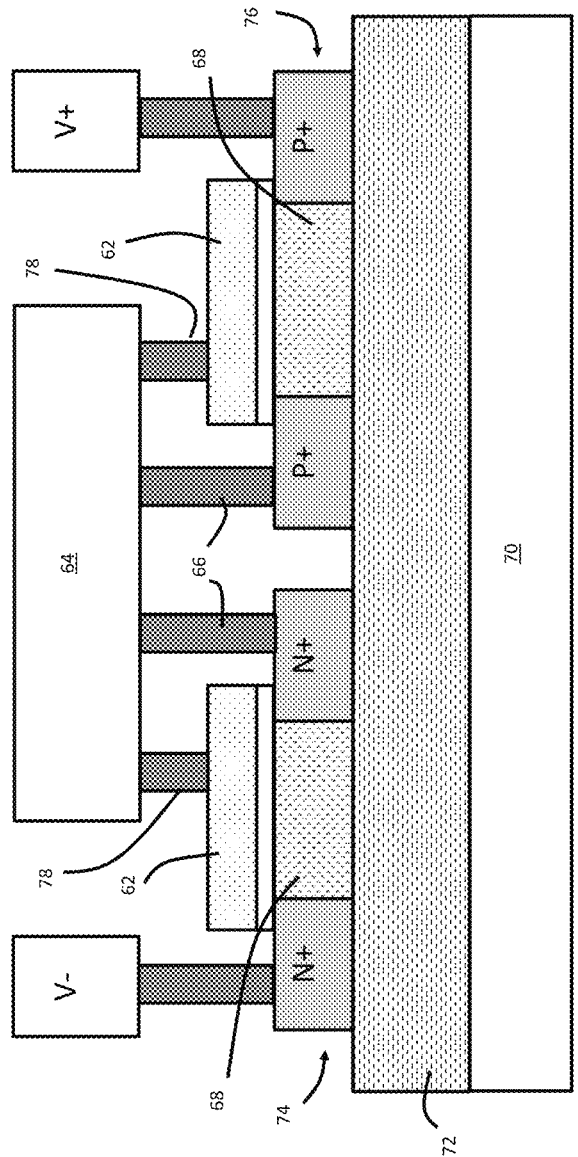
FIG. 4 shows a cross-sectional view of a second implementation of the device shown in FIG. 1 according to embodiments of the present disclosure.

FIG. 4 depicts a cross-sectional view of an illustrative planar embodiment 60 of circuit 10 employed using FDSOI technology. In this embodiment 60, the n-type device (N+) 74 and p-type device (P+) 76 are formed adjacent each other on a buried insulator 72 (e.g., SiO2) which is formed on a substrate 70 (e.g., a semiconductor or insulator material). Each device includes an undoped body region 68 between the respective device's source and drain. The gate electrode material 62 for each device resides on a gate insulator above the body region, and gates 62 of both devices are connected with vias 78 and a wire (i.e., metal 1 layer) 64. The drain regions of both devices are also connected to the wire 64 by way of vias 66, thus creating circuit 10 shown in FIG. 1.

Figure 5:
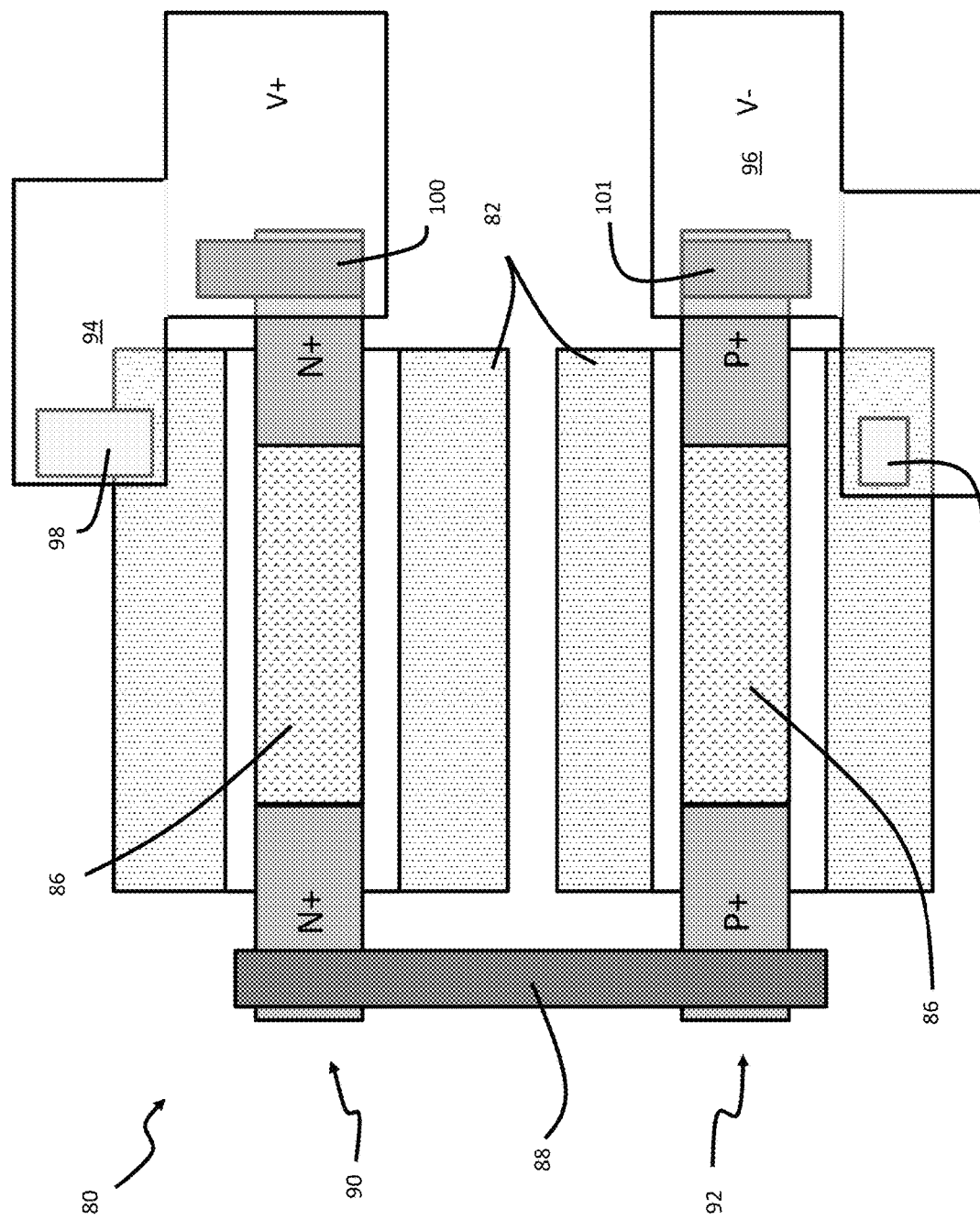
FIG. 5 shows a top view of a first implementation of the device shown in FIG. 2 according to embodiments of the present disclosure.

FIG. 5 depicts a top, cross-sectional view of an illustrative embodiment of circuit 12 (FIG. 2) using fully depleted technology implemented as FinFET 80. In this embodiment, the source regions of the n-type device (N+) 90 and p-type device 92 (P+) are connected with a strap 88, and each device 90, 92 includes an undoped fin region 86 between their respective source/drain regions. The drain of the n-type device 90 is connected to its gate 82 by way of via 100, wire 94, and via 98. Similarly, the drain of the n-type device 92 is connected to its gate by way of via 101, wire 96 and via 99.

Figure 6:
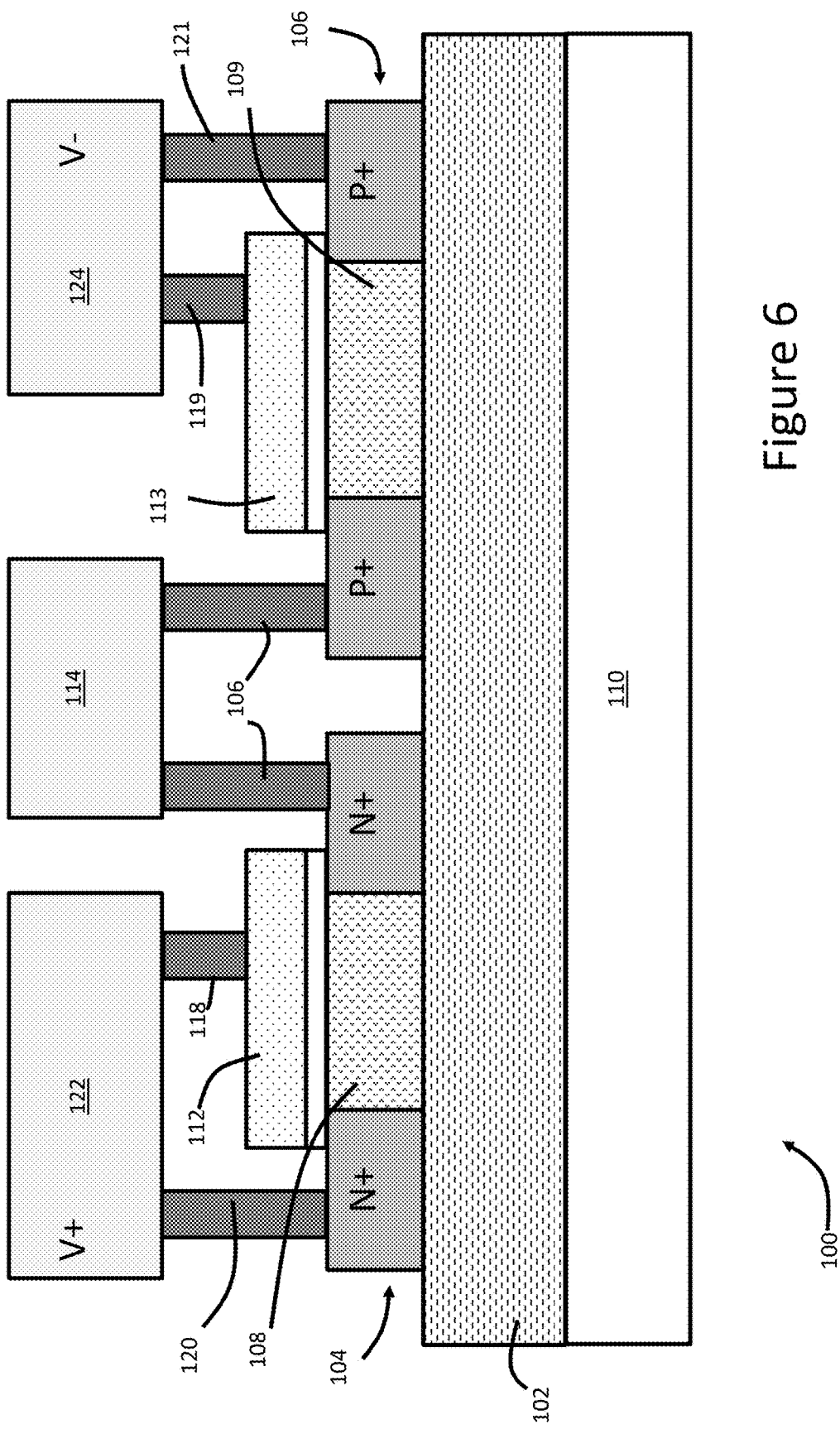
FIG. 6 shows a cross-sectional view of a second implementation of the device shown in FIG. 2 according to embodiments of the present disclosure.

FIG. 6 depicts a cross-sectional view of an illustrative planar embodiment 100 of circuit 12 (FIG. 2) employed using FDSOI technology. In this implementation, the n-type device (N+) 104 and p-type device (P+) 106 are formed adjacent each other on a buried insulator 102 (e.g., SiO2) which is formed on a substrate 110 (e.g., a semiconductor or insulator material). Each device includes an undoped body region 108, 109 between the respective device's source and drain. The gate electrode material 112, 113 for each device resides on a gate insulator above the body region. Gate 112 of the n-type device 104 is connected to both V+ and the device's drain region with vias 118, 120 and wire 122. Similarly, gate 113 of the p-type device 106 is connected to both V− and the device's drain region with vias 119, 121 and wire 124. The source regions of both devices 104, 106 are connected together by wire 114 by way of vias 106, thus creating circuit 12 shown in FIG. 2.

As is evident with the approach described herein, the threshold voltage is largely insensitive to process variations. Namely, because both the n-type MOSFET and p-type MOSFET employ an identical gate stack, variations in work-function and dipole moments are canceled to give very small variation in the regulator voltage, as the signs of the electrical contributions due to variations in gate composition are opposite in the two devices. Further, because both the n-type MOSFET and p-type MOSFET are fully depleted and employ undoped channels, there is no sensitivity due to body doping variations. Also, because long gates are utilized, sensitivity to lithographic variations in gate length is avoided. Although some sensitivity remains, resulting from oxide and body thickness variation, the impact is very small due to the fact that the devices are implemented using undoped bodies.

A further feature of the invention is the fact that the reference voltage provided by this invention is below 1 volt, and more specifically can be provided at approximately 0.7V at threshold current (e.g., +/−10%).

The nMOS and pMOS FET threshold voltages (Vtn and Vtp) are determined by that gate voltage, with respect to the source voltage, at which a transition from weak inversion to strong inversion is effected. For undoped, fully depleted, long-channel devices, this voltage corresponds to a difference between the gate work-function (WF) and the conduction-band energies (Ec) of about 300 meV (milli-electron-Volts) for nMOS FETs and a difference between the gate work-function and the valence-band energies (Ev) of about −300 meV (milli-electron-Volts) for pMOS FETs. This arrangement results in cancellation of the common work-function (WF) potentials of the series FETs of the inventive structures, resulting in a reference voltage given approximately by the intrinsic properties of the semiconductor, namely the valence-band and conduction-band energies.

$Vtn = WF - (Ec + \ln(Ninv\text{-}n/Nc))$ $Vtp = WF - (Ev - \ln(Ninv\text{-}p/Nv))$ $Vtn - Vtp = (Ev - Ec) + \ln(NcNv/(Ninv\text{-}n \times Ninv\text{-}p))$ ~1.2 V−2*0.25V=0.7V reference at threshold current Where Ev and Ec are the valence and conduction-band energies, respectively, for the semiconductor, and Ninv-n, Ninv-p are the electron and hole inversion densities, respectively, at threshold voltage.

The sub-threshold swing, Ssat, is the exponential growth rate of the current when the MOSFET is operated in sub-threshold mode, and for these MOSFETs is near ideal, or given by 2 kT/Qe. This simple behavior enables use of the inventive structure in well-known regulator circuits which make use of this well-controlled exponential growth.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A reference device, comprising:
   a fully depleted n-type metal oxide-silicon field effect transistor (MOSFET) implemented as a long channel device having a substantially undoped body; and
   a fully depleted p-type MOSFET implemented with as a long channel device having a substantially undoped body;
   wherein the n-type MOSFET and p-type MOSFET are connected in series and employ identical gate stacks, wherein each MOSFET has a gate electrically coupled to a respective drain thereof to form two diodes, and wherein both diodes are in one of an on state and an off state according to a polarity of an electrical potential applied across the n-type MOSFET and p-type MOSFET.

2. The reference device of claim 1, wherein the n-type MOSFET and p-type MOSFET include FinFETs.

3. The reference device of claim 1, wherein the n-type MOSFET and p-type MOSFET include fully depleted semiconductor-on-insulator (FDSOI) planar MOSFETs.

4. The reference device of claim 1, wherein a source of the n-type MOSFET provides a negative terminal, a source of the p-type MOSFET provides a positive terminal, and gates of both the n-type MOSFET and p-type MOSFET are connected to a drain of both the n-type MOSFET and p-type MOSFET.

5. The reference device of claim 1, wherein a drain of the n-type MOSFET provides a positive terminal, a drain of the p-type MOSFET provides a negative terminal, the gate of the n-type MOSFET is connected to the drain of the n-type MOSFET, the gate of the p-type MOSFET is connected to the drain of the p-type MOSFET, and a source of both the n-type MOSFET and p-type MOSFET are connected.

6. The reference device of claim 1, wherein an output reference voltage is less than one volt.

7. The reference device of claim 6, where the output reference voltage is approximately 0.7 volts.

8. An integrated circuit (IC) having a reference device, comprising:
   a fully depleted n-type metal oxide-silicon field effect transistor (MOSFET) implemented as a long channel device having a substantially undoped body; and
   a fully depleted p-type MOSFET implemented as a long channel device having a substantially undoped body;
   wherein the n-type MOSFET and p-type MOSFET are connected in series and employ identical gate stacks, wherein each has a gate electrically coupled to a drain thereof, and both are in one of an on state and an off state according to a polarity of an electrical potential applied across the n-type MOSFET and p-type MOSFET.

9. The IC of claim 8, wherein the reference device operates with a reference output voltage less than one volt.

10. The IC of claim 8, wherein the n-type MOSFET and p-type MOSFET include FinFETs.

11. The IC of claim 8, wherein the n-type MOSFET and p-type MOSFET include fully depleted semiconductor-on-insulator (FDSOI) planar MOSFETs.

12. The IC of claim 8, wherein a source of the n-type MOSFET provides a negative terminal, a source of the p-type MOSFET provides a positive terminal, and gates of both the n-type MOSFET and p-type MOSFET are connected to a drain of both the n-type MOSFET and p-type MOSFET.

13. The IC of claim 8, wherein a drain of the n-type MOSFET provides a positive terminal, a drain of the p-type MOSFET provides a negative terminal, a gate of the n-type MOSFET is connected to the drain of the n-type MOSFET, a gate of the p-type MOSFET is connected to the drain of the p-type MOSFET, and a source of both the n-type MOSFET and p-type MOSFET are connected.

14. A method of forming a reference circuit, comprising:
   forming a fully depleted n-type metal oxide-silicon field effect transistor (MOSFET) and a fully depleted p-type MOSFET adjacent each other, wherein both MOSFETs are implemented as long channel devices having substantially undoped bodies, and wherein each has a commonly formed gate stack; and
   wiring the n-type MOSFET and p-type MOSFET in series in which each has a gate electrically coupled to a drain thereof and both can be placed in one of an on state and an off state according to a polarity of an electrical potential applied across the n-type MOSFET and p-type MOSFET.

15. The method of claim 14, wherein the forming includes forming the n-type MOSFET and p-type MOSFET as FinFET structures.

16. The method of claim 14, wherein the forming includes forming the n-type MOSFET and p-type MOSFET as fully depleted semiconductor-on-insulator (FDSOI) planar MOSFETs.

17. The method of claim 14, wherein a source of the n-type MOSFET is arranged to provide a negative terminal, a source of the p-type MOSFET is arranged to provide a positive terminal, and gates of both the n-type MOSFET and p-type MOSFET are connected to a drain of both the n-type MOSFET and p-type MOSFET.

18. The method of claim 17, wherein gates of both the n-type MOSFET and p-type MOSFET and drains of both the n-type MOSFET and p-type MOSFET are connected with vias and a via strap.

19. The method of claim 14, wherein a drain of the n-type MOSFET is arranged to provide a positive terminal, a drain of the p-type MOSFET is arranged to provide a negative terminal, and wherein the gate of the n-type MOSFET is connected to the drain of the n-type MOSFET, the gate of the p-type MOSFET is connected to the drain of the p-type MOSFET, and a source of both the n-type MOSFET and p-type MOSFET are connected.

20. The method of claim 19, wherein the gate of the n-type MOSFET is connected to the drain of the n-type MOSFET with vias and a wire, the gate of the p-type MOSFET is connected to the drain of the p-type MOSFET with vias and a wire, and the source of both the n-type MOSFET and p-type MOSFET are connected with vias and a wire.

* * * * *